United States Patent
Shelton et al.

(10) Patent No.: US 8,199,577 B2
(45) Date of Patent: Jun. 12, 2012

(54) RIPPLE PROGRAMMING OF MEMORY CELLS IN A NONVOLATILE MEMORY

(75) Inventors: Douglas Edward Shelton, Wylie, TX (US); John Howard MacPeak, Garland, TX (US); Eddie Hearl Breashears, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 229 days.

(21) Appl. No.: 12/627,593

(22) Filed: Nov. 30, 2009

(65) Prior Publication Data
US 2011/0128787 A1 Jun. 2, 2011

(51) Int. Cl.
*G11C 16/04* (2006.01)
(52) U.S. Cl. ......... 365/185.14; 365/185.08; 365/185.23; 365/185.01
(58) Field of Classification Search ............. 365/185.14, 365/185.08, 185.23, 185.01
See application file for complete search history.

(56) References Cited

U.S. PATENT DOCUMENTS
2005/0162908 A1* 7/2005 Kato .................. 365/185.2
* cited by examiner

*Primary Examiner* — Thong Q Le
(74) *Attorney, Agent, or Firm* — Rose Alyssa Keagy; Wade J. Brady, III; Frederick J. Telecky, Jr.

(57) ABSTRACT

An electrically erasable programmable read-only memory (EEPROM) with a ripple programming mode. Memory cells in an the EEPROM array include floating-gate transistors with control gates coupled to corresponding word lines, and drain electrodes coupled to corresponding bit lines. A memory cell is programmed by applying a high programming voltage to its control gate along with applying a high programming voltage to its drain. Multiple memory cells within a row can be programmed by applying the programming voltage to the word line of that row, during which multiple bit lines receive their programming voltage, without removing the word line programming voltage when changing the programming from one bit line to another.

18 Claims, 7 Drawing Sheets

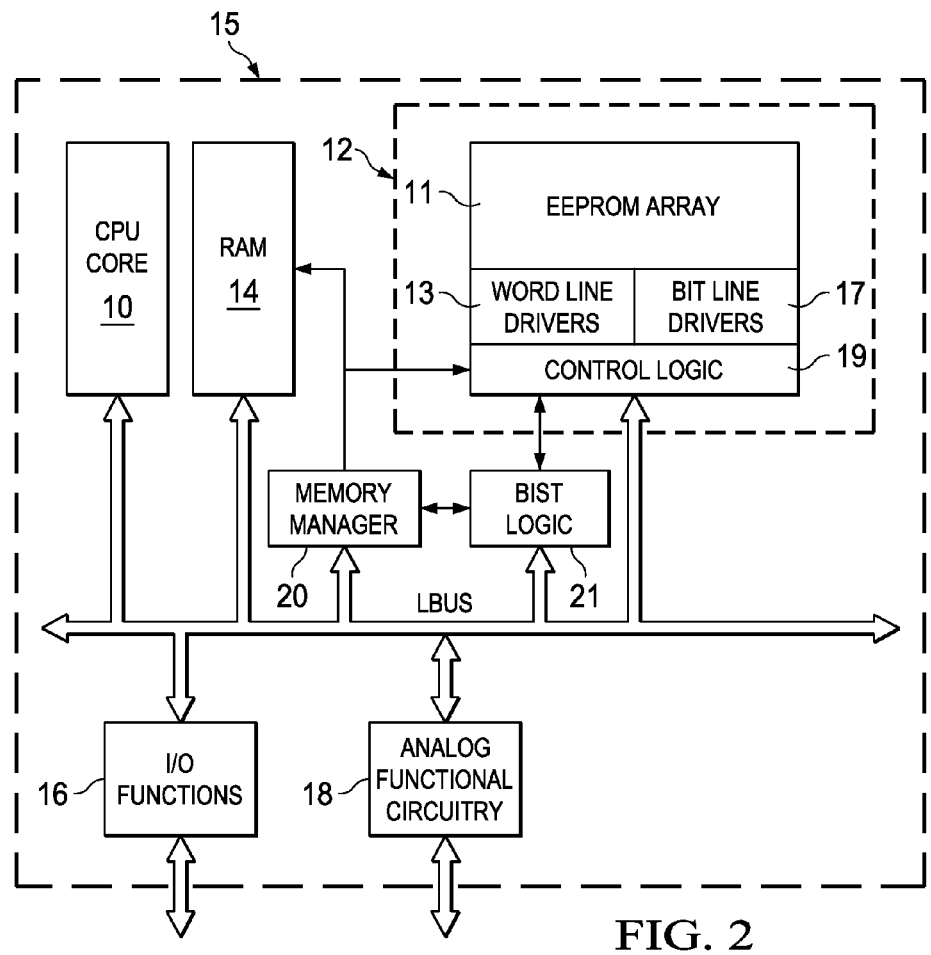
FIG. 2
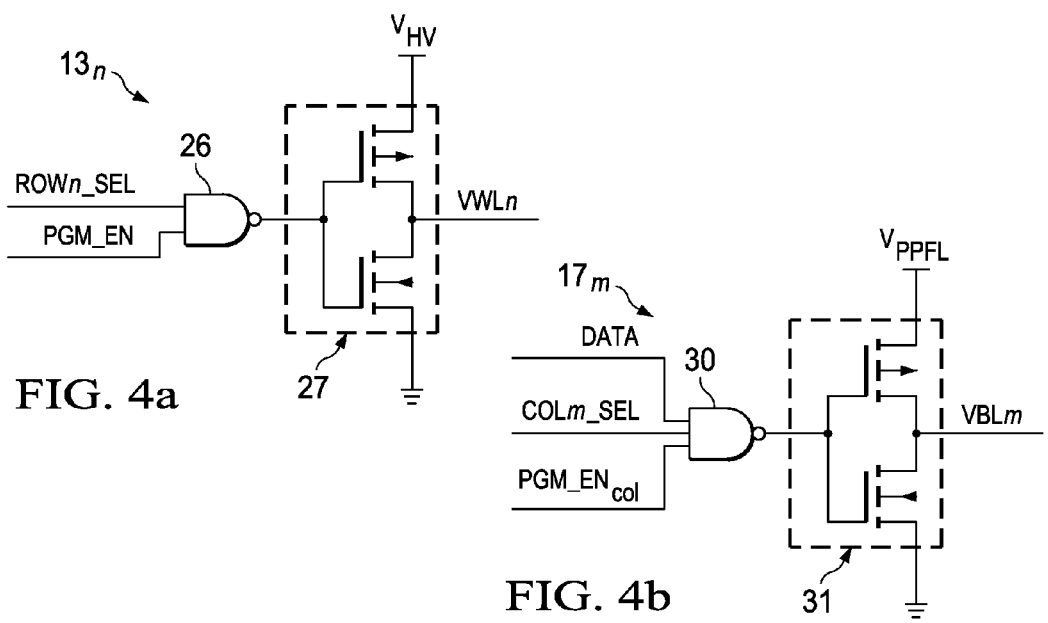
FIG. 4a
FIG. 4b

RIPPLE PROGRAMMING OF MEMORY CELLS IN A NONVOLATILE MEMORY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of nonvolatile semiconductor memory. Embodiments of this invention are more specifically directed to the programming of memory cells in an electrically erasable read-only memory of the flash type.

Non-volatile solid-state read/write memory devices are now commonplace in many electronic systems, particularly in portable electronic devices and systems. A common technology for realizing non-volatile solid-state memory devices, more specifically for realizing electrically erasable programmable "read-only" memory (EEPROM) devices, utilizes "floating-gate" transistors to store the data state. According to this conventional technology, the memory cell transistor is "programmed" by biasing it so that electrons tunnel through a thin dielectric film onto an electrically isolated transistor gate element. The trapped electrons on the floating gate raise the apparent threshold voltage of the memory cell transistor (for n-channel devices), as compared with the threshold voltage with no electrons trapped on the floating gate. The stored state can be read by sensing the presence or absence of source-drain conduction under bias.

Modern EEPROM devices are "erasable" in that the memory cell transistors can be biased to remove the electrons from the floating gate, by reversing the tunneling mechanism. Some EEPROM memory devices are of the "flash" type, in that a large number (a "block") of memory cells can be simultaneously erased in a single operation. Conventional EEPROM memories can be arranged in a "NOR" fashion, which permits individual cells in each column to be separately and individually accessed. Flash EEPROM memories are also now commonly arranged as "NAND" memory, in which the source/drain paths of a group of memory cells in a column are connected in series. NAND memories can be constructed with higher density, but require all of the cells in a group to be biased to access any one of the cells in that group.

Because of the convenience and efficiency of modern flash EEPROM memories, it is now desirable and commonplace to embed EEPROM memory within larger scale integrated circuits, such as those including modern complex microprocessors, microcontrollers, digital signal processors, and other large-scale logic circuitry. Such embedded EEPROM can be used as non-volatile program memory storing software routines executable by the processor, and also as non-volatile data storage.

According to one approach, floating-gate EEPROM cells are realized by metal-oxide semiconductor (MOS) transistors having two polysilicon gate electrodes. A control gate electrode in one polysilicon level is electrically connected to decode and other circuitry in the EEPROM integrated circuit, and a floating gate in another polysilicon level is disposed between the control gate electrode and the channel region of the memory transistor. In this conventional construction, the application of a high programming voltage to the control gate capacitively couples to the floating gate, and attracts electrons from the source and drain regions of the transistor to an extent that some tunnel to, and remain trapped on, the floating gate.

FIG. 1a illustrates the electrical arrangement of conventional EEPROM memory cell 2 constructed according to this double-polysilicon construction. Memory cell 2 consists essentially of a single transistor with its drain connected to bit line BL, its source at ground, and its control gate connected to word line WL. A floating gate electrode is physically disposed between the control gate and the channel region of the transistor of memory cell 2, and is thus electrically isolated from the control gate, source, and drain of the transistor. The specific physical arrangement of the floating gate relative to the other elements of memory cell 2 can vary, depending on the particular design, as known in the art.

FIG. 1b illustrates a conventional arrangement of a non-volatile memory including array 5. Array 5 includes floating-gate EEPROM memory cells 2, arranged in rows and columns. While the number of memory cells 2 in array 5 shown in FIG. 1b is very small (sixteen cells 2, in four rows and four columns), for purposes of this description, typical conventional EEPROM arrays include many more cells. Indeed, some modern non-volatile memories include thousands of memory cells 2 on a common word line. In array 5 of FIG. 1b, each row of memory cells 2 shares a common one of word lines WL0, WL1, WL2, WL3, each driven by one word line drivers 6. Each column of memory cells 2 shares a common one of bit lines BL0, BL1, BL2, BL3, each driven by one of bit line drivers 4 and coupled to one of sense amplifiers 8.

In both read and write operations, one of word lines WL0, WL1, WL2, WL3 is selected according to a row portion of an address value, and driven active by the corresponding one of word line drivers 6. As will be described in further detail below, the voltages applied in read and write operations differ. In a write operation, one or more of bit lines BL0, BL1, BL2, BL3 is selected, according to a column portion of an address value, and is driven by its corresponding one of bit line drivers 4 with the appropriate programming voltage corresponding to the data state to be written as indicated on input data lines DATA IN (i.e., whether the cell is to be programmed or not). In a read operation, bit line drivers 4 bias one or more of bit lines BL0, BL1, BL2, BL3, and sense amplifiers 8 sense the state of one or more of bit lines BL0, BL1, BL2, BL3. The particular columns from which data are to be read can be selected, in response to a column portion of the address value, by either bit line drivers 4, sense amplifiers 8, or by circuitry downstream from sense amplifiers 8. The state of the selected memory cells 2 are output from sense amplifiers 8 on lines DATA OUT.

In conventional floating-gate EEPROMs, as mentioned above, an absence of trapped electrons is the "erased" state of the memory cell, and is evident by the (n-channel) floating-gate transistor having a low threshold voltage. This state is typically considered to be a logical "1", as drain-to-source current is conducted in response to a read voltage applied at the control gate. The "programmed" state in which electrons are trapped on the floating gate results in the floating-gate transistor having a high threshold voltage, in which source/drain current does not conduct with a read voltage applied to the control gate; this state is typically considered to be a logical "0".

The programming of a "0" state into memory cell 2, constructed in this double-gate manner, is typically performed by the application of a high voltage at the control gate along with a relatively strong drive (voltage and current) at the drain of the floating-gate transistor of memory cell 2, with the source of the transistor at ground. For example, in one conventional technology, a programming voltage of about 9.2 volts is applied to the control gate of memory cell 2 being programmed, in combination with a voltage of about 4.2 volts to the drain of the floating-gate transistor of memory cell 2, both voltages relative to the ground level at the source of that transistor. The physical mechanism involved in the programming operation is Fowler-Nordheim tunneling of "hot" electrons from the transistor channel region through the gate dielectric and into the floating gate electrode, to which the high control gate voltage is capacitively coupled. The high voltages and relatively high currents (e.g., on the order of 150 µA/bit) required by the programming mechanism are commonly generated by on-chip charge pump circuits. Typical programming cycle times are relatively long (e.g., on the order of microseconds), and include not only the duration of the programming pulse but also significant rise and fall times for the high voltage levels. These long programming times are in sharp contrast with the relatively fast read access cycle times (e.g., below 100 nsec), and as such various memory management techniques are used to reduce the system impact of the programming cycles.

A conventional approach to reducing the system impact of the long programming times is to program multiple bits simultaneously, in a parallel programming operation. Some conventional flash EEPROM memories are capable of simultaneously programming as many as 128 bits at once. However, additional widening of the parallelism of the programming operation beyond this practical limit is believed to be practical, because of the size of the driver transistors required to drive the large programming currents, as well as the required size for the charge pumps and other support circuitry.

Another conventional approach to reducing the system effect of EEPROM programming is known in the art as "EEPROM emulation mode". In this programming mode, the EEPROM array is paired with a static random access memory (SRAM) array. Upon power-up or on demand, the previous contents of an EEPROM block are written into the SRAM array, and the processor or other memory host modifies those contents by writing to the SRAM array (rather than directly programming cells in the EEPROM array). As a background operation or upon power-down of the integrated circuit, the EEPROM block is flash-erased, and is then programmed with the now-modified contents contained within the SRAM array. This programming operation can be performed in a "column-fast" manner, to reduce the programming overhead time, as will now be described relative to FIG. 1c in combination with FIG. 1b.

In the example shown in FIG. 1c, row address n is applied to row address decode circuitry associated with word line driver 6. This row address n of course indicates the word line to be activated during the programming operation, and thus the row in which memory cells 2 are to be programmed in this operation. During this row address time, the input data (lines DATA_IN) are in a don't care state, word line drivers 6 are driving all word lines low (shown on line VWL in FIG. 1c), and bit line drivers 4 are driving all bit lines low (shown on line VBL in FIG. 1c). These polarities correspond to the floating-gate transistors of memory cells 2 being n-channel devices. Upon the decoding and latching of row address n, one of word line drivers 6 drives the selected word line to a high voltage $V_{HV}$, which as mentioned above can be on the order of 9.2 volts. This high word line voltage VWL is applied to the control gates of all memory cells 2 controlled by the selected word line, and is capacitively coupled to the corresponding floating gates, so as to attract electrons from the channel region of any of those memory cells 2 that are biased to conduct drain-to-source current. As shown in FIG. 1c, because of the significant load presented by the selected word line and the memory cell gates connected to the word line (which, as mentioned above, can number into the thousands), the rise time of voltage VWL from a low level to the desired high voltage $V_{HV}$ is significant, as shown by time $t_{VWLS}$ in FIG. 1c.

Column address m is presented at a point in time following the presentation and latching of row address n, as is the input data value corresponding to the desired state to be programmed into the addressed memory cell 2 (i.e., corresponding to row n, column m). After allowing for a rise time of the voltage VWL, specified as time $t_{VWLS}$ in FIG. 1c, and if the input data value indicates that the addressed memory cell 2 is to be programmed, one of bit line drivers 4 drives the selected bit line corresponding to column address m with a high voltage level $V_{PPFL}$, for example on the order of 4.2 volts, with sufficient current drive (e.g., 150 µA) that a sufficient number of electrons tunnel into and are trapped on the floating gate of the addressed memory cell 2. This programming pulse on the selected bit line is shown in FIG. 1c as bit line voltage VBL. A minimum programming pulse width $t_{PRG}$ is typically specified for the duration of this high voltage $V_{PPFL}$ on the selected bit line. As shown in FIG. 1c, the rise time of bit line voltage VBL is generally much shorter than that of word line voltage VWL, because of the much reduced load presented by a diffused bit line than that presented by the long word line and its floating gate electrodes. After the programming pulse time $t_{PRG}$ (at least) elapses, the appropriate bit line driver 4 deactivates the bit line voltage VBL on the selected bit line.

In this conventional column-fast approach in which the same row address is retained for multiple programming operations, the word line voltage VWL is deactivated between column addresses. As such, following the fall time $t_{VWLD}$ of the word line voltage VWL, commencing with the bit line voltage VBL reaching its inactive level, a new column address m+1 (which need not be the next sequential column in the array) can then be presented and decoded, along with the input data value corresponding to that address. The same word line corresponding to row address n is then driven to its high voltage $V_{HV}$, allowing a rise time $t_{VWLS}$, following which the bit line corresponding to the new column address m+1 is then driven to its high level $V_{PPFL}$, if the input data indicates that the cell is to be programmed.

The column-fast programming approach for EEPROM emulation mode as shown in FIG. 1c is known to greatly improve the efficiency of programming flash memory from that in a "random access" mode in which both the row and column address must be presented with each programming pulse. The programming "overhead" time is reduced by this column-fast mode to on the order of 8 µsec per address location, as opposed to 20 µsec per address location in the random access mode. However, as evident from FIG. 1c, each incremental additional programming pulse in a row requires a minimum of the word line rise time $t_{VWLS}$, the programming pulse $t_{PRG}$, and the word line fall time $t_{VWLD}$. As such, the overall programming process in conventional EEPROMs is limited by this sum of these specified time periods, and by the limited number of bits that can be programmed in parallel.

By way of further background, access modes such as "page mode" and "extended data out (EDO)" in dynamic random access memories (DRAM) are known in the art. In these DRAM access modes, a row in the memory array is selected and remains active while multiple column addresses are decoded in sequence, to access multiple cells within the same addressed row within the single row address cycle.

BRIEF SUMMARY OF THE INVENTION

Embodiments of this invention provide a solid-state non-volatile memory, and method of operating the same, in which the programming time is reduced.

Embodiments of this invention provide such a memory and method in which improved programming efficiency can be attained in an EEPROM emulation mode of operation.

Embodiments of this invention provide such a memory and method in which the data word width can be extended while achieving the improved efficiency.

Embodiments of this invention provide such a memory and method in which the column addresses can be sequentially or randomly advanced within a single row while achieving the improved efficiency.

Embodiments of this invention provide such a memory and method that is realized for an embedded non-volatile memory in a logic circuit such as a programmable processor or system-on-a-chip.

Embodiments of this invention provide such a memory and method in which the programming word line and bit line voltages can be controlled internally to the integrated circuit, such as by built-in-self-test circuitry, externally from the integrated circuit, or a combination thereof.

Other objects and advantages of this invention will be apparent to those of ordinary skill in the art having reference to the following specification together with its drawings.

Embodiments of this invention may be implemented into an integrated circuit containing a non-volatile memory array of floating-gate transistor memory cells. The memory cells in each row of the array share a common word line that is coupled to the floating gate of each memory cell in that row, while the memory cells in each column of the array share a bit line, for example coupled to the drain of the floating gate transistors. Control circuitry controls a word line driver to energize and maintain a high programming voltage on a selected word line over multiple programming pulses in a column-fast programming cycle. By programming multiple memory cells within a row without cycling the word line voltage, a substantial increase in programming efficiency can be attained.

Embodiments of this invention can be realized, to particular advantage, in large-scale integrated circuits with embedded non-volatile memory, such as may be used for program memory for a programmable on-chip processor. The number of instances that the non-volatile memory is rewritten in such an application is limited, which avoids degradation from the hot carrier effect. The invention is particularly well-suited for applications in which non-volatile memory contents are rewritten only at system power-down, such as in an automotive environment.

BRIEF DESCRIPTION OF THE SEVERAL VIEWS OF THE DRAWING

FIG. 2 is an electrical diagram, in block form, of a large-scale integrated circuit including embedded electrically erasable programmable read-only memory (EEPROM) according to an embodiment of this invention.

FIGS. 4*a* and 4*b* are electrical diagrams, in schematic form, of a word line driver and a bit line driver in the EEPROM memory of FIG. 3, constructed according to that embodiment of the invention.

DETAILED DESCRIPTION OF THE INVENTION

Figure 1A:
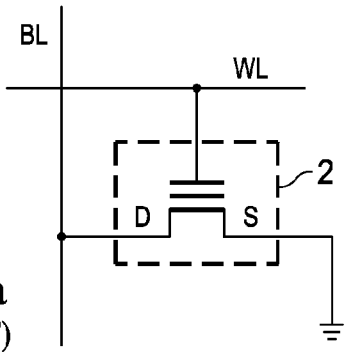
FIG. 1*a* is an electrical diagram, in schematic form, of a conventional double-polysilicon floating gate memory cell.
Figure 1B:
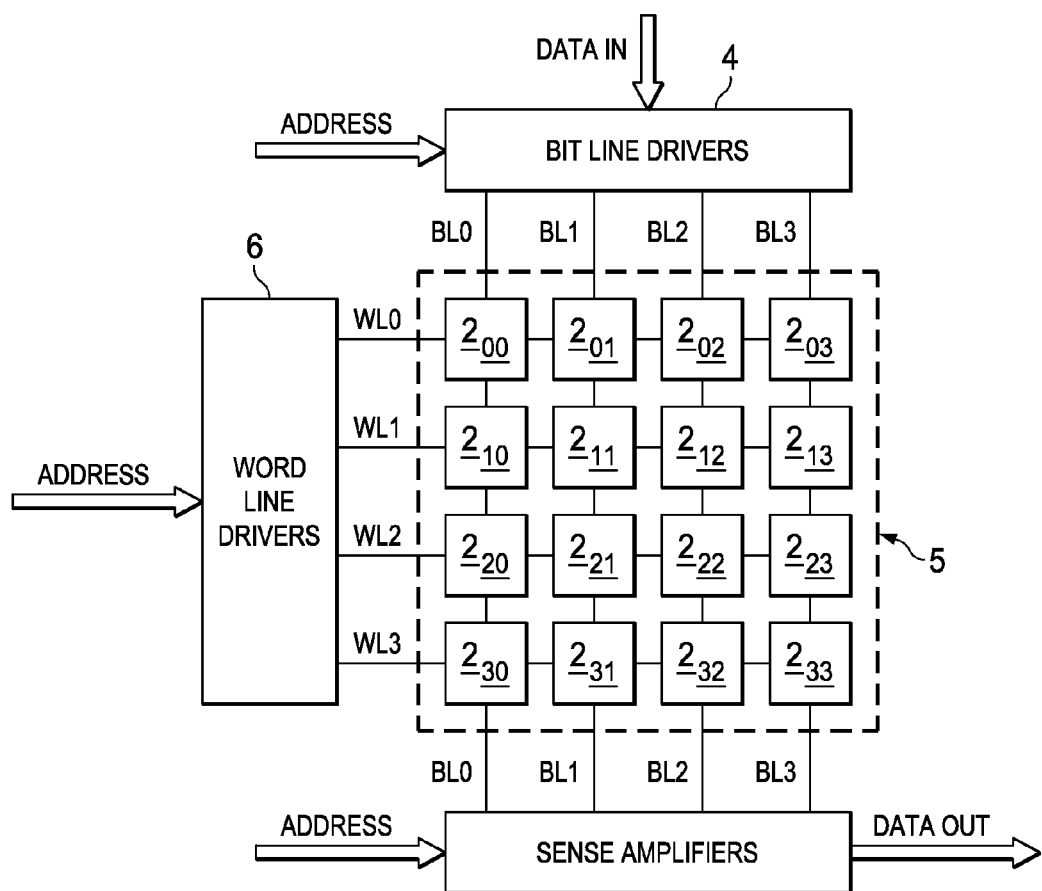
FIG. 1*b* is an electrical diagram, in block form, of a conventional non-volatile memory.

This invention will be described in connection with one or more of its embodiments, namely as implemented into an integrated circuit as an embedded solid-state non-volatile flash memory of the NOR type, in which the memory cells are constructed as double-polysilicon floating-gate transistors, because it is contemplated that this invention will be especially beneficial in such an application. However, it is contemplated that this invention can provide important benefits in other applications, including stand-alone non-volatile memories of various types and construction. Accordingly, it is to be understood that the following description is provided by way of example only, and is not intended to limit the true scope of this invention as claimed.

An example of an embodiment of the invention is illustrated, in functional block diagram form, in FIG. 2. Integrated circuit 15 is a large scale integrated circuit that includes functional circuitry in combination with embedded electrically erasable read-only (EEPROM) memory 12, all formed in a single integrated circuit die or chip. In this example of FIG. 2, the functional circuitry constitutes central processing unit (CPU) core 10, which may be a conventional microprocessor or digital signal processor CPU core as known in the art. Integrated circuit 15 includes such other functions as typical for a large-scale programmable processor, such as read-only memory (RAM) 14, input/output functions 16, and the like, each of which communicate with CPU core 10 via local bus LBUS. Other circuit functions (not shown) as clock circuits, timers, power management circuits, special functionality, control circuits such as direct memory access controllers, and the like are also typically included within large scale integrated circuits such as integrated circuit 15.

Analog functional circuitry 18 is also provided in integrated circuit 15, and includes any one or more of a number of analog functions, such as signal level conversion, bandgap reference voltage generation, reference current generation, voltage regulation, analog input/output functions, and the like. EEPROM cells can be provided in conjunction with analog functional circuitry 18, for example to programmably set or "trim" reference voltage and current levels useful to analog functional circuitry 18.

EEPROM memory 12, as embedded within integrated circuit 15 as shown in FIG. 2, includes EEPROM array 11. As typical in the art, EEPROM array 11 is realized by a relatively large number of EEPROM memory cells arranged in rows and columns. Access to the desired memory cells within EEPROM array 11 is controlled by control logic 19 within EEPROM memory 12. Control logic 19 includes such functionality as address decode circuitry, which in this example selects the desired EEPROM memory cells for reading, programming, or erasing, in response to address signals communicated to EEPROM memory 12 over local bus LBUS, for example from CPU core 10. As will be described in further detail below, that address decode circuitry within control logic 19 will, in programming operations, communicate the selected row to word line drivers 13, and the selected column to bit line drivers 17; in such programming operations, word line drivers 13 and bit line drivers 17 will be controlled by control logic 19 to apply higher voltage levels than applied in read operations, in a manner consistent with embodiments of this invention. In addition, it is contemplated that control logic 19 will also receive input data to be written (i.e., programmed) into selected memory locations of EEPROM array 11 via local bus LBUS, for example from CPU core 10. Other circuitry (not shown) is also incorporated within EEPROM memory 12 and its control logic 19, including sense amplifiers for effecting read operations, and control logic for performing erase operations, including block erase operations for the case in which EEPROM memory 12 is of the "flash" type.

In this particular embodiment of the invention, integrated circuit 15 also includes memory manager function 20, which is in communication with local bus LBUS and with EEPROM memory 12 and RAM 14. In this example, memory manager 20 controls the operation of integrated circuit 15 in an "EEPROM emulation mode" in which the contents of some or all of EEPROM array 11 are read into RAM 14, with subsequent modifications to those contents being made to locations within RAM 14 rather than being immediately programmed into EEPROM array 11. Upon power-down or some other event, memory manager 20 erases the corresponding block or blocks of EEPROM array 11, for example in a block erase operation, and then programs the modified contents stored in RAM 14 into the appropriate locations of EEPROM array 11. Substantial efficiencies can be attained, according to this embodiment of the invention, by programming those contents into EEPROM array 11 in a "ripple" programming mode in which cells are programmed row-by-row, with the cells in each row programmed within a single high voltage pulse of the corresponding word line. The construction and operation of EEPROM memory 12 in attaining improved efficiency in this and other programming operations will be described in further detail below in this specification.

Also according to this embodiment of the invention, integrated circuit 15 also includes built-in-self-test (BIST) logic 21. As known in the art, many integrated circuits include a BIST or power-on-self-test (POST) functionality, by way of which functions within the integrated circuit are functionally tested upon power up of the device. According to another embodiment of the invention, the ripple programming of EEPROM array 11 is used in connection with such a BIST function, thus achieving improved efficiency in the power-up sequence of integrated circuit 15.

Figure 3:
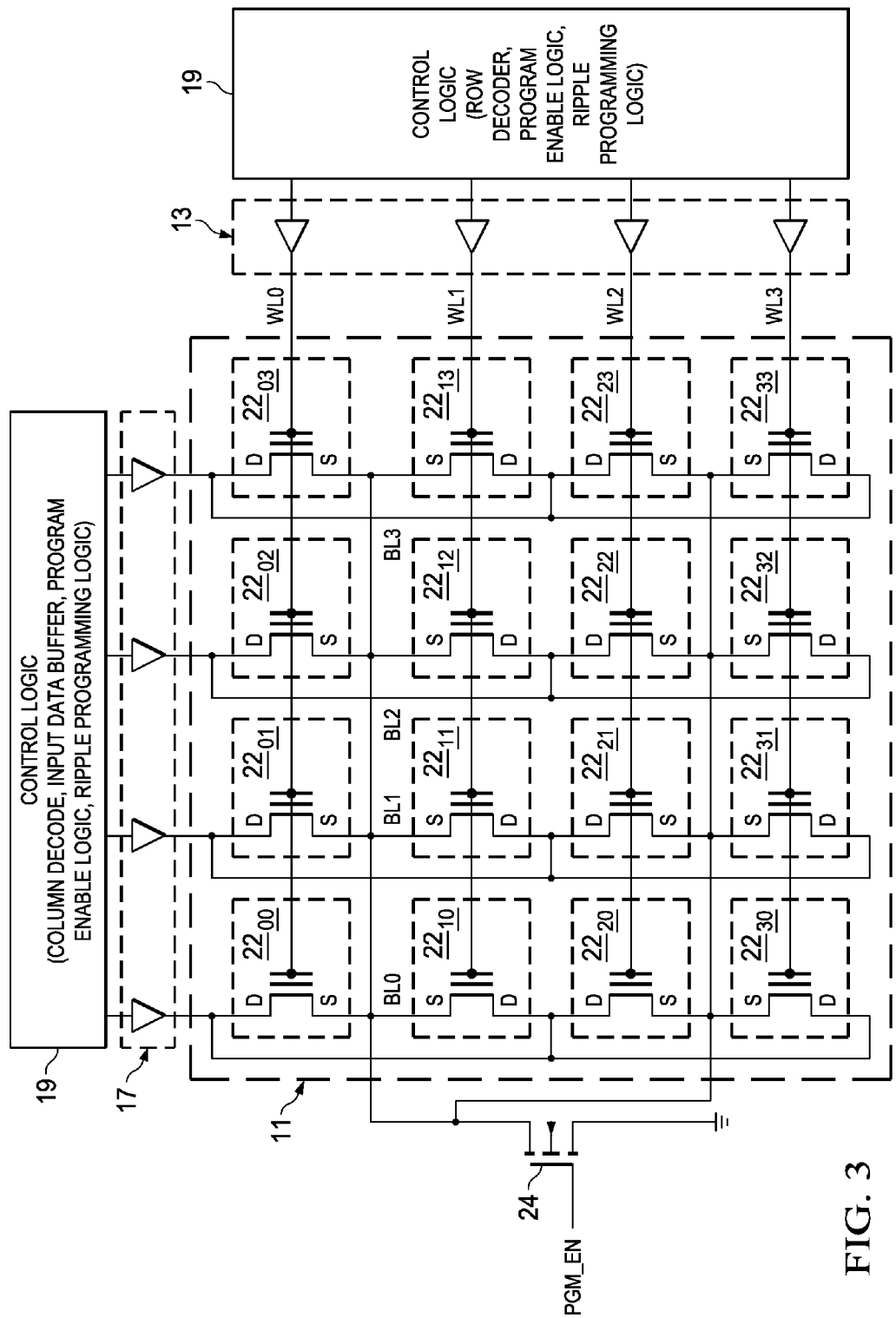
FIG. 3 is an electrical diagram, in block and schematic form, of a portion of an EEPROM memory in the integrated circuit of FIG. 2, constructed according to that embodiment of the invention.

FIG. 3 illustrates the construction of portions of EEPROM memory 12, according to an embodiment of the invention in which EEPROM memory cells 22 are arranged in four rows and four columns within EEPROM array 11. This small size of EEPROM array 11 is used in this description for the sake of clarity, it being understood by those skilled in the art that the number of memory cells 22 in a typical EEPROM array 11 can number as many as 2 k cells per row, and 512 or more cells per column. According to embodiments of the invention, EEPROM memory cells 22 are realized according to a double-level polysilicon technology, by way of which each memory cell is realized by a floating-gate transistor that also has a control gate electrode, similarly as described above relative to FIG. 1a. As conventional for this construction, the control gate electrode of the floating-gate transistor of each memory cell 22 is connected to one of the word lines WL0 through WL3, the drain (D) of the transistor is connected to one of the bit lines BL0 through BL3, and the source (S) of the transistor is biased to ground via transistor 24. The gate of transistor 24 is controlled by program enable signal PGM_EN, or by another control signal generated by control logic 19 as usual in EEPROM memories constructed in this manner. For purposes of this description, and as typical in the art, the floating-gate transistors of EEPROM memory cells 22 are n-channel transistors, in which the floating gate electrode is an electrically isolated polysilicon element that is physically disposed under all or part of the control gate electrode (which is realized in a different level of polysilicon from the floating gate electrode), and that overlies the transistor channel region in the conventional manner (i.e., the floating gate electrode is separated from the channel region by a tunnel dielectric film). It is contemplated that any one of the legion of conventional EEPROM memory cell construction approaches known in the art, particularly those having separate control gate and floating gate electrodes, can be used to realize EEPROM memory cells 22 in this embodiment of the invention.

Each of word lines WL0 through WL3 is driven by one of word line drivers 13, under the control of control logic 19. As will be evident from this description, word line drivers 13 are controlled by functions within control logic 19, such functions including a row address decoder, program enable logic that controls the enabling and operation of a programming operation, and ripple programming control logic for controlling word line drivers 13 to operate according to the ripple programming approach of embodiments of this invention. It is contemplated that those skilled in the art having reference to this specification will be readily able to construct and otherwise realize these functions in control logic 19, by way of combinational or sequential logic arranged in the manner appropriate for a given implementation.

FIG. 4a illustrates the construction of word line driver instance $13_n$, which drives word line voltage VWLn onto word line WLn, according to an embodiment of the invention. In this example, NAND gate 26 receives program enable control signal PGM_EN from control logic 19 at one input, and receives row select signal ROWn_SEL from a row address decoder function within control logic 19 at another input. The output of NAND gate 26 is coupled to the gates of transistors of inverting driver 27. Inverting driver 27 includes series-connected p-channel and n-channel transistors with their source/drain paths connected in series between programming voltage $V_{HV}$ and ground, and their gates connected to the output of NAND gate 26. Programming voltage $V_{HV}$ is contemplated to be a relatively high voltage, such as on the order of 9.2 volts; it is contemplated that a charge pump or other high voltage generating circuit within integrated circuit 15 is provided to generate this programming voltage $V_{HV}$, with sufficient current capacity to adequately drive the large load presented by word line WLn. The output of inverting driver 27 drives word line WLn. It is contemplated that a multiplexer between the output of inverting driver 27 and word line WLn, or a multiplexer or other circuitry that selects the voltage biasing inverting driver 27, or some other circuit function, will be used to apply voltages other than programming voltage $V_{HV}$ to the selected word line WLn in other operations, such as erase, standby, etc., via word line driver $13_n$.

In operation in a general sense, program enable control signal PGM_EN is driven to an active high level by control logic 19 at such times as a programming cycle is to be active. In this example, row select signal ROWn_SEL is driven to an active high level by control logic 19 if the row address indicates that a programming operation is to be performed to one or more memory cells 22 in row n. This combination of an active high level for program enable signal PGM_EN and an active high level on line ROWn_SEL indicates that one or more memory cells 22 in row n are to be programmed. In response, NAND gate 26 drives a low level at its output, causing inverting driver 27 to drive a voltage near or at programming voltage $V_{HV}$ at its output, driving this high voltage onto word line WLn as word line voltage VWLn. During programming cycles in which the row address indicates that memory cells 22 in a row other than row n are to be programmed, line ROWn_SEL will be at a low level, in which case NAND gate 26 will drive a high level at its output, which causes inverting driver 27 to pull word line WLn to ground.

As shown in FIG. 3, bit line drivers 17 drive bit lines BL0 through BL3 under the control of functions within control logic 19, including a column address decoder, input data buffers, program enable logic, and ripple programming control logic. Again, it is contemplated that those skilled in the art having reference to this specification will be readily able to construct and otherwise realize these functions in control logic 19, by way of combinational or sequential logic arranged in the manner appropriate for a given implementation.

FIG. 4b illustrates the construction of bit line driver instance $17_m$, which drives bit line voltage VBLm onto bit line BLm to program a memory cell 22 to which bit line BLm is coupled, in this embodiment of the invention. In this example, inputs of NAND gate 30 are connected to receive a input data mask state on line DATA, program enable control signal $PGM\_EN_{col}$ from control logic 19, and column select signal COLm_SEL from a column address decoder function within control logic 19. Program enable control signal $PGM\_EN_{col}$ applied to bit line driver 17m may be a different signal from the program enable signal (PGM_EN) applied to word line drivers 13, particularly in the case in which program enable control signal $PGM\_EN_{col}$ is the signal controlling the timing of the programming pulse applied to the corresponding bit lines BLm. The output of NAND gate 30 is coupled to the gates of transistors of inverting driver 31, which is constructed as a power inverter of p-channel and n-channel transistors with their source/drain paths connected in series between programming voltage $V_{PPFL}$ and ground, and their gates connected to the output of NAND gate 30. In this embodiment of the invention, programming voltage $V_{PPFL}$ is contemplated to be a relatively high voltage, such as on the order of 4.2 volts, from a voltage supply within integrated circuit 15 capable of supplying sufficient current (via inverting driver 31) to support electron tunneling for those memory cells 22 being programmed in the same cycle. It is contemplated that a charge pump or other high voltage generating circuit within integrated circuit 15 is provided to generate this programming voltage $V_{PPFL}$ at the necessary programming current level. The output of inverting driver 31 drives bit line BLm. Again, it is contemplated that voltages other than the high programming voltage will be applied to bit lines BL0 through BL3 in read and standby cycles. As such, it is contemplated that a multiplexer between the output of inverting driver 31 and bit line BLm, or a multiplexer or other circuitry that selects the voltage that biases inverting driver 31, or some other circuit function, will be used to allow bit line driver $17_m$ to apply the appropriate voltage to the corresponding bit line BLm in those various operations.

In its general operation, program enable control signal PGM_EN is driven to an active high level by control logic 19 at such times as a programming cycle is to be active, as mentioned above. Column select signal COLm_SEL is driven to an active high level by control logic 19 if the column portion of the desired address indicates that a programming operation is to be performed to a memory cell 22 associated with column m; data mask value DATA is at a high logic level if that memory cell 22 is to be programmed to a "0" level (i.e., if electrons are to be trapped on its floating gate). This combination of an active high levels at its inputs cause NAND gate 30 to drive a low level at its output, which in turn causes inverting driver 31 to apply a high voltage at or near programming voltage $V_{FFPL}$ to bit line BLm, as bit line voltage VBLm. If bit line BLm is either unselected, or selected but the memory cell 22 is not to be programmed (i.e., left in the erased "1" state), NAND gate 30 will drive a high level at its output, which causes inverting driver 30 to pull bit line BLm to ground.

In this example, one memory cell $22_{n,m}$ is associated with selected word line WLn and selected bit line BLm. Given this operation of word line driver $13_n$ and bit line driver $17_m$, during the programming pulse time, this selected memory cell $22_{n,m}$ will have the high programming voltage $V_{HV}$ at its control gate, and the high programming voltage $V_{FFPL}$ at its drain, with transistor 24 pulling its source to ground. Under this condition, the high programming voltage $V_{HV}$ will couple to the floating gate electrode of memory cell $22_{n,m}$, and electrons will be attracted to, causing some electrons to tunnel from the drain of the floating-gate transistor into the floating gate, programming memory cell $22_{n,m}$.

The operation of EEPROM memory 12 to program one or more of memory cells 22 in a random access mode, in this embodiment of the invention, essentially follows a conventional approach. EEPROM memory 12 is presented with a memory address (row and column portions) and with one or more data bits to be written to one or more memory cells 22 associated with that memory address; in the example of integrated circuit 15 shown in FIG. 2, that memory address and input data will be communicated to EEPROM memory 12 over local bus LBUS. In a single bit (x1) architecture, a single data bit will be provided to EEPROM memory 12 with each memory address. As known in the art, EEPROM memory 12 may be arranged to have a multiple bit-width input/output data path (e.g., x4, x8, x16, etc.), in which case a multiple-bit data word is provided with each memory address. Of course, in that multiple bit-width architecture, a corresponding number of memory cells 22 can be selected and potentially energized (depending on the data state of each bit to be stored) to program the input data word. Typically, these multiple memory cells 22 reside in the same row, with multiple columns corresponding to each column address.

Alternatively, sense amplifiers 8 and other circuitry in EEPROM memory 12 may be constructed so that each memory cell 22 can effectively store a data value constituting more than one binary digit. For example, multi-level programming of EEPROM memory cells is known in the art, in which each memory cell can be programmed to a selected one of three or more possible threshold voltages. Such EEPROM memories are referred to in the art as "MLC", for "multi-level cell". Typically, MLC EEPROMs are of the NAND type. The programming operation in such MLC memories typically involves iterative program-and-read operations, to ensure that the cell is programmed to the correct level. And in addition, MLC programming may be used in EEPROM architectures having multiple bit-width input/output architectures.

Figure 5:
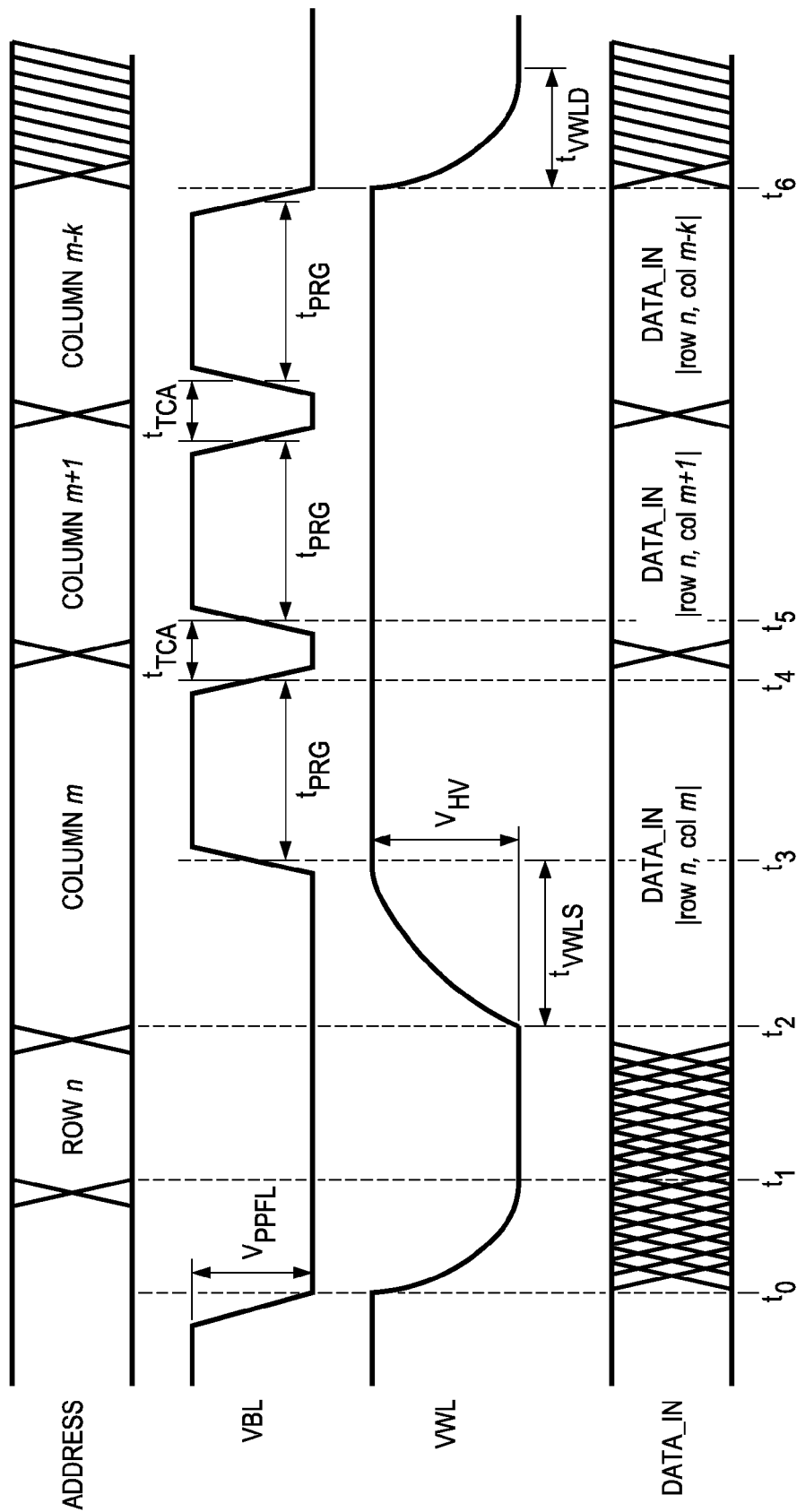
FIG. 5 is a timing diagram illustrating the operation of the EEPROM memory of FIG. 3 in a ripple programming mode, according to an embodiment of the invention.

Referring now to FIG. 5, the operation of EEPROM memory 12 in its ripple programming mode, according to an embodiment of the invention, will now be described in detail in connection with an example of a programming operation within a single row of EEPROM array 11. As will become apparent from the following description, this invention provides important improvement in programming efficiency in the ripple programming mode, particularly in column-fast programming of multiple memory cells (i.e., multiple column addresses) within a single row.

At time $t_0$, preparation for programming of multiple memory cells within row n begins, with bit line voltage VBL for all columns, and word line voltage VWL for all rows, being driven to a low level, thus deselecting all columns and rows. The address value and input data values for the previous cycle become or change to "don't care" values, to which EEPROM memory 12 is not responsive. At time $t_1$, a valid row portion n of the next memory address is presented to control logic 19 for decoding and selection of the corresponding word line WLn. This address may be presented on local bus LBUS synchronously with a clock or address strobe, or may instead by statically decoded by EEPROM memory 12. This row portion n propagates through control logic, and is applied to the corresponding word line driver 13m beginning at time $t_2$, at which (in this example), the corresponding word line WLn begins its transition to the high programming voltage $V_{HV}$. This high programming voltage is significantly higher than the voltage applied to word line WLn during read or other operations. For example, programming voltage $V_{HV}$ may be on the order of 9.2 volts. Because of the large capacitive load presented by the typically large number of control gates coupled to word line WLn, and also because of the substantial parasitic resistance and inductance of the word line conductor itself, rise time $t_{VWLS}$ of word line voltage VWL from 0 v to $V_{HV}$ is significant, for example as long as on the order of 2 μsec. While higher current drive by word line driver 13n would reduce that rise time $t_{VWLS}$, factors such as the available chip area, power dissipation, and other parameters limit the available drive current. The designer must thus base the desired drive current on a trade-off of these limiting factors, on one hand, with the rise time $t_{WLS}$ that can be tolerated from a performance standpoint, on the other hand.

At or prior to time $t_2$, a valid column portion m of the memory address, and also the input data state DATA_IN for the memory cell or cells 22 associated with row n and column m are received. It is not essential that the column address and data transition begin at time $t_2$ as shown in FIG. 5, so long as sufficient setup time for these values is provided prior to the programming pulse on the selected bit line BLm, which occurs at time $t_3$. Again, this column address and the input data may be presented on local bus LBUS (or internally generated within EEPROM memory 12) synchronously with a clock or strobe, or may be statically received and decoded. In addition, while FIG. 5 illustrates the column address m as time-multiplexed with the row address value n, these two address portions may be communicated on separate conductors from one another.

At time $t_3$, bit line driver $17_m$ corresponding with the column m indicated in the column portion m of the received address drives bit line BLm to its high programming voltage $V_{PPFL}$, if the input data state DATA_IN for the corresponding memory cell 22 indicates that the cell is to be programmed to a "0" level. As mentioned above, the timing of this programming pulse on the selected bit line BLm may be controlled by program enable signal $PGM\_EN_{col}$. If more than one column in EEPROM array 11 correspond to this column address portion m, all of those columns (i.e., bit lines BL) corresponding to column address m and for which the input data state is a "0" will receive a high programming voltage $V_{PPFL}$ at time $t_3$. Of course, if EEPROM memory 12 supports a data path wider than one bit (i.e., x4, x8, etc.), then only those bit lines BL for the current column address that are also associated with a "0" input data state will receive the high programming voltage $V_{PPFL}$. Conversely, bit lines BL associated with column address values other than m, and those bit lines associated with column address m but for which the input data state is "1" (i.e., the erased state), will not receive the high programming voltage $V_{PPFL}$.

As mentioned above, the voltage level $V_{PPFL}$ applied by bit line driver 17m in this programming operation is substantially higher than that applied to bit line BLm during read or other operations. For example, bit line programming voltage level $V_{PPFL}$ may be on the order of 4.2 volts, at a drive current (e.g., 150 μA) sufficient to cause an adequate number of electrons to tunnel through the dielectric film and become trapped on the floating gate of the addressed memory cell or cells 22.

Bit line voltage VBL on selected bit line BLm remains at this high voltage $V_{PPFL}$ for a specified duration $t_{PRG}$. The duration $t_{PRG}$ of the programming pulse of bit line voltage VBL (while the word line voltage VWL is also at its high programming level $V_{HV}$) depends on the particular construction of EEPROM memory 12, including the construction and operating parameters of memory cells 22. A typical specified programming pulse duration $t_{PRG}$ is on the order of 2 μsec, continuing until time $t_4$ in the example of FIG. 5.

At time $t_4$ the programming pulse ends as bit line voltage VBL on selected bit line BLm makes a transition to a low level. In the example of FIG. 5, another memory cell (or cells) 22 within the same row m is to be programmed. According to this embodiment of the invention, a new column address portion m+1 is received, decoded, and applied to the corresponding bit line driver $17_{m+1}$ without deactivating word line driver 13n, and thus while maintaining word line voltage VWL on word line WLn at the high programming voltage $V_{HV}$. Accordingly, the high-to-low (active-to-inactive) transition of bit line voltage VBL is effected while maintaining word line voltage VWL on word line WLn at voltage $V_{HV}$, as shown at the time period following time $t_4$ in FIG. 5. This low level is maintained on all bit lines BL in EEPROM array 11, by all bit line drivers 17, for a specified duration $t_{TCA}$, during which a new column address portion m+1 (in this example) is presented, and during which an input data transition occurs, for this new column address portion m+1. The minimum duration of this transition time $t_{TCA}$ is contemplated to be relatively short, for example one-fourth of the minimum programming pulse duration $t_{PRG}$. As will be evident from the following description, the particular value of column address portion m+1 relative to the previous column address portion m need not be sequential, and in fact may not have any relationship to that previous column address portion.

Alternatively, circuitry may be provided within EEPROM memory 12 that automatically and sequentially steps through bit line drivers 17, to enable the programming of each memory cell 22 within a row n within a single extended row address active cycle. In this case, external column address signals would not have to be generated, received, decoded, etc. in order to advance to the next column in the sequence.

In either case, also during the duration $t_{TCA}$ following the programming pulse for column m, the input data state makes its transition to provide the input data state for the memory cell or cells 22 for the next column address m+1 in row n. Upon receipt, decoding, and propagation of the new column address m+1 and its corresponding input data state to the corresponding bit line driver $17_{m+1}$, bit line voltage VBL is then driven to the high programming voltage $V_{PPFL}$ and applied to bit line BLm+1, at time $t_5$. Those memory cells 22 associated with column address m+1 in row n, and for which the input data state indicates a "0" programmed state, are then programmed during the programming pulse duration $t_{PRG}$ following time $t_5$.

Any number of different column address values can be presented within the same programming operation to the current row n, while the high programming voltage $V_{HV}$ remains active on the corresponding word line WLn. As shown in FIG. 5, the next occurrence of the transition time $t_{TCA}$ involves receipt, decoding, and propagation of column address m-k, along with its corresponding input data values on lines DATA_IN. As evident from the value m-k for this column address, it is not essential that the column address values advance from cycle to cycle in a single direction, but rather these address values can be presented in any order desired, according to this embodiment of the invention. Alternatively, it is contemplated that bit line drivers 17 or control logic 19 may be constructed so that certain efficiencies may be available if the column addresses advance in only a single direction, or if other constraints are implemented on the order in which column addresses are applied.

At the point at which no additional memory cells 22 associated with row n remain to be programmed, word line driver 13n can de-energize word line WLn, by driving word line voltage VWL to ground. This is shown in FIG. 5 as following the programming pulse $t_{PRG}$ for the programming of cell or cells 22n associated with column address m-k, at time $t_6$. Fall time $t_{VWLD}$ is required for word line voltage VWL to discharge from its high programming level $V_{HV}$, due to the substantial load presented by word line WLn, including the parasitic capacitance presented by the control gates of the associated memory cells 22 in row n, and the resistance and inductance of the conductor forming word line WLn. It is contemplated that this fall time $t_{VWLD}$ typically requires about one-half of the rise time $t_{VWLS}$, for example 1 μsec in the example described above.

Once word line voltage VWL on word line WLn reaches an inactive level, a new programming cycle can commence, either as a ripple programming operation for multiple columns associated within a row, or as a random access programming operation applied to a single address, as required by integrated circuit 15.

Figure 1C:
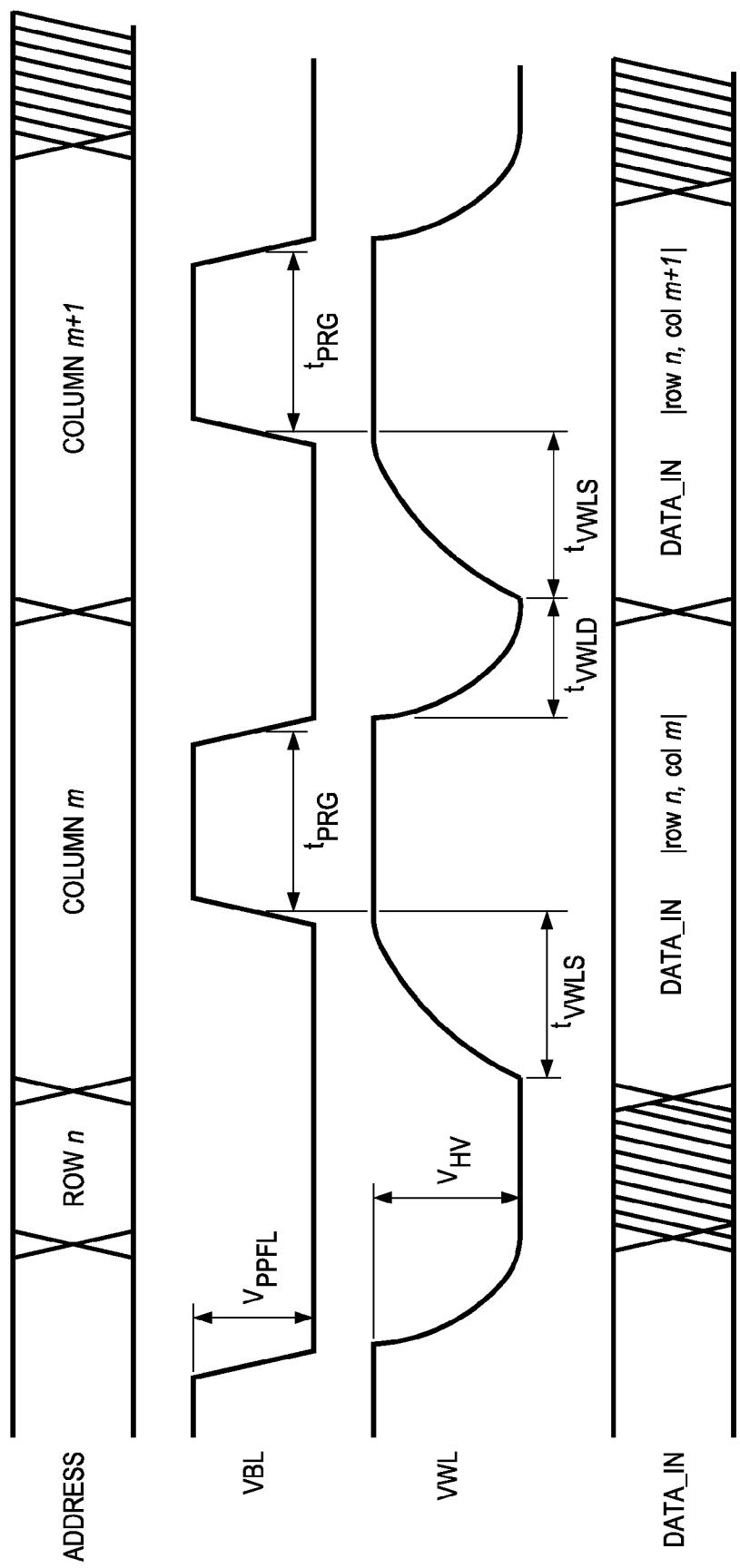
FIG. 1*c* is a timing diagram illustrating the operation of a conventional column-fast programming operation applied to multiple memory cells within a common row of the memory of FIG. 1*b*.

According to this embodiment of the invention, the incremental time required to program memory cells 22 associated with a single column address value, within the ripple programming operation within an already selected row, is substantially reduced from that required according to conventional methods. As described above relative to FIG. 1c for the conventional column-fast programming operation, the incremental time required for programming cells associated with the next column address, once a row has been selected, is the sum of the word line rise time $t_{VWLS}$, the programming pulse $t_{PRG}$, and the word line fall time $t_{VWLD}$. This is because the word line voltage VWL must make both transitions for each additional column address in the same row. Because of the significant load presented by the word line, these word line voltage rise and fall times dominate the time required to program cells for each additional column address.

In contrast, according to this embodiment of the invention, the incremental time required to program cells associated with an additional column address, within the already-selected row, consists only of the sum of programming pulse time $t_{PRG}$ and the transition time $t_{TCA}$, as evident from FIG. 5.

The word line voltage VWL makes no transitions in order to program these additional cells along the same row, in this ripple programming approach. As a result, this incremental time is not affected by the word line rise and fall times, but instead depends only on the programming pulse duration and the much shorter rise and fall times of the bit line voltages, which results in substantial time savings. As an aside, the "overhead" time for initial presentation and decoding of the row address, charging and discharging the word line voltage VWL once, and the like are the same for the two approaches.

In the example described above relative to FIG. 5, the incremental time for programming an additional column, within an already selected row, is 2.5 μsec (programming pulse time $t_{PRG}$ is 2 μsec and transition time $t_{TCA}$ is 0.5 μsec). According to the conventional approach of FIG. 1c, that incremental time would amount to 5.0 μsec. By extension, for an example in which 128 column addresses are programmed within a single row, the programming time required according to this embodiment of the invention (and including the overhead time) amounts to 323 μsec, while the programming time required under the conventional approach, for the same 128 column addresses, would amount to 649 μsec. This large difference in programming time is especially noticeable when operating a EEPROM in its "EEPROM emulation mode", in which all rows of the EEPROM array (e.g., as many as 512 rows or more) are programmed. The system performance provided by this embodiment of the invention becomes very significant when considered over that large number of row addresses.

It is contemplated, in connection with this invention, that some electrical stress may be present at memory cells 22 by maintaining a high programming level (e.g., as high as 9.2 volts) on the selected word line WLn while "hot" switching the bit line drive, within a ripple programming operation such as shown in FIG. 5. More particularly, it is contemplated that threshold voltage effects due to "hot electron" or "hot carrier" damage at the gate electrode/gate dielectric interface is a distinct possibility if such switching is performed a large number of times. However, it has been discovered, in connection with this invention, that certain applications of EEPROM memory, particularly as embedded non-volatile memory within a larger scale integrated circuit such as integrated circuit 15 described above, generally involve very few programming cycles.

Figure 6:
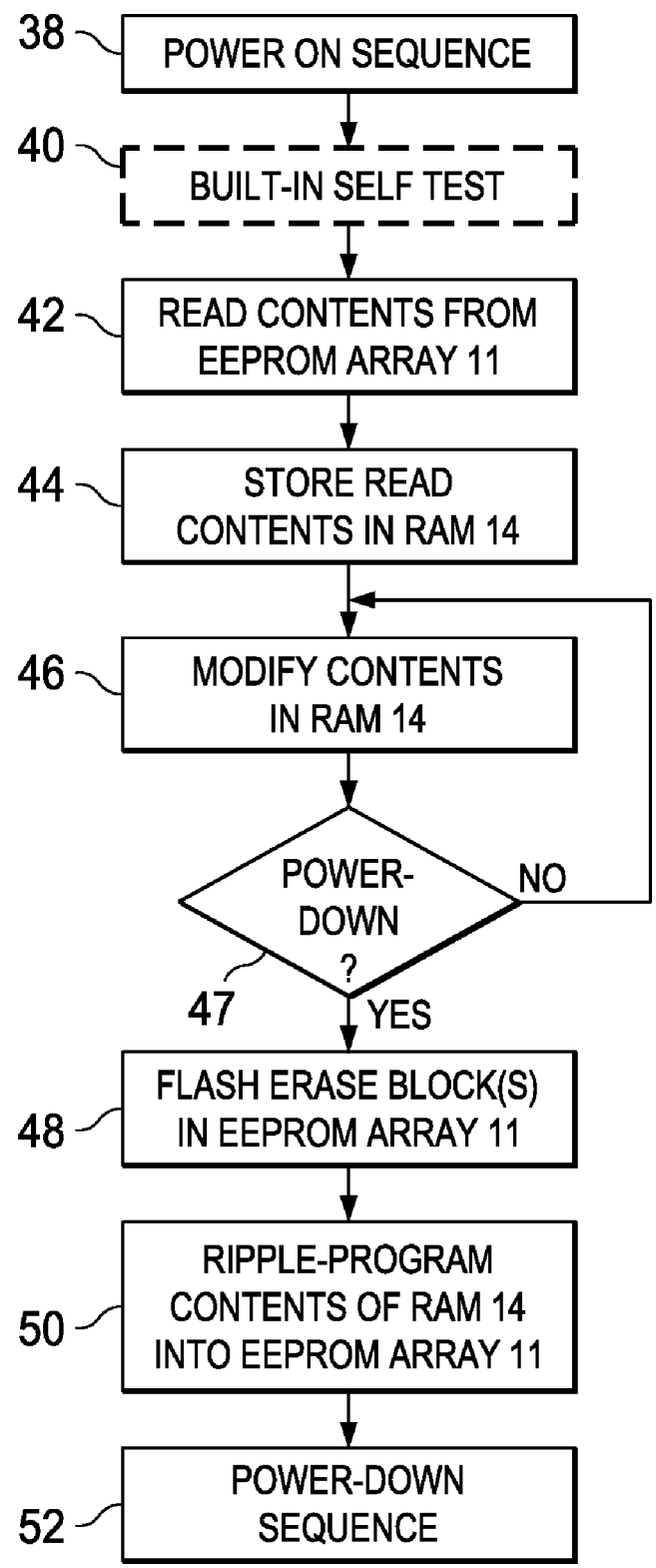
FIG. 6 is a flow diagram illustrating the operation of the large-scale integrated circuit of FIG. 2, including use of the EEPROM memory of FIG. 3 in an EEPROM emulation mode, according to an embodiment of this invention.

For example, a system controller integrated circuit in an automobile typically includes an embedded EEPROM memory operated in "EEPROM emulation mode", such that its contents are programmed only once each time the engine is started (more accurately, when the ignition is turned off). The number of times that an automobile is turned on and off is relatively low, as compared with the hundreds of thousands of erase/programming cycles contemplated by EEPROM designers for general purpose EEPROM memory. Accordingly, it is contemplated that embodiments of this invention can especially be used to advantage in applications such as embedded EEPROM memory where the number of programming cycles is expected to be (or is controlled to be) relatively low. Referring now to FIG. 6, an example of the operation of integrated circuit 15, including embedded EEPROM memory 12, in performing ripple programming in EEPROM emulation mode according to an embodiment of this invention, and as applicable to an automotive application, will now be described. Of course, this embodiment of the invention and indeed this example of its operation are not limited to automotive uses, but can be used in connection in a wide range of applications.

Integrated circuit 15 executes power-on sequence 38 in response to being powered up. As known in the art, conventional large-scale integrated circuits, such as microprocessors and the like, are capable of sensing their own power-up, and are hard-programmed to carry out a power-up or reset sequence to enter a known stable state from which execution of program instructions can begin. In the automotive example, power-on sequence 38 can be initiated by the driver turning the ignition switch of the automobile to its "on" position.

As part of or subsequent to power-on sequence 38, integrated circuit 15 can (optionally) carry out built-in self-test (BIST) process 40, which includes certain operations that integrated circuit 15 performs itself to ensure that its own functions are properly functional. As known in the art, BIST process 40 can involve tests such as scan-testing of logic functions and read/write tests of memory resources. In integrated circuit 15 of this embodiment of the invention, BIST logic 21 manages BIST process 40, if performed. According to another embodiment of this invention, as will be described below in connection with FIG. 7, BIST process 40 uses the ripple programming of this invention.

Following power-on sequence 38, and BIST process 40 if performed, integrated circuit 15 reads contents stored in EEPROM array 11, in process 42. And in process 44, these contents that are read from EEPROM array 11 are stored in RAM 14. In the architecture of FIG. 2, processes 42 and 44 are performed under the control of memory manager function 20, and as such need not involve CPU core 10. For example, memory manager function 20 can generate the appropriate address and control signals to each of EEPROM memory 12 and RAM 14, either over local bus LBUS or directly to EEPROM memory 12, and can also include buffers to temporarily store the contents read from EEPROM array 11 prior to writing those contents to RAM 14. Such buffering can allow other operations to be carried out over local bus LBUS. In addition, it is contemplated that processes 42, 44 can be carried out effectively simultaneously or in alternating fashion, to minimize the buffering required.

In this operational example, process 46 is then performed by CPU core 10 and other functions in integrated circuit 15, to modify the contents stored in RAM 14. It is contemplated that this modification process 46 occurs within the scope of the normal operation of integrated circuit 15; in the automotive example, CPU core 10 executes modifying process 46 in carrying out its intended tasks for operation of the automobile. Decision 47 is then executed to determine whether a power-down sequence has been requested, for example by polling to determine whether a power-down interrupt has been received. If power-down is not requested (decision 47 is no), then normal operation of integrated circuit 15 continues, including further modification of the contents of RAM 14 in additional instances of process 46.

Upon receiving a request for the power-down of integrated circuit 15 (decision 47 is yes), for example by the driver turning off the automobile ignition switch, memory manager function 20 or other circuitry performs erase process 48, in which one or more blocks of memory cells 22 in EEPROM array 11, corresponding to the memory locations that were read and the contents stored in Ram 14, are erased. Alternatively, it is contemplated that this block or blocks of EEPROM array 11 can be erased, under the control of memory manager function 20, as a background process during the normal operation of integrated circuit 15, if desired.

In either case, after the power-down sequence has been requested (decision 47 is yes) and after the appropriate block or blocks of EEPROM array 11 are erased in process 48, integrated circuit 15 programs EEPROM array 11 with the contents of RAM 14, in process 50. Programming process 50, in this embodiment of the invention, is carried out by memory manager function 20, which reads the contents of RAM 14 (corresponding to the original contents of EEPROM array 11, as modified in instances of process 46), buffers these contents as necessary, and then controls EEPROM memory 12 to carry out the programming of those modified contents into the appropriate memory locations of EEPROM array 11. More specifically, in this embodiment of the invention, process 50 is performed in a row-by-row manner, using ripple programming cycles as described above in connection with this embodiment of the invention, and as shown by way of example in FIG. 5. As described above, this ripple programming approach programs multiple memory cells associated with each row of EEPROM array 11, according to a sequence of multiple corresponding column addresses in combination with the data states indicated by the stored contents retrieved from RAM 14 during a single extended pulse of the high programming voltage $V_{HV}$ driven onto the appropriate word line WL. The manner and sequence according to which the appropriate memory addresses (row and column) are presented to EEPROM memory 12 is under the control of memory manager function 20; alternatively, it is contemplated that functions within control logic 19 of EEPROM memory 12 can receive the contents to be written in combination with a ripple programming control signal, and in response can internally generate and sequence the row and column addresses in an automatic and sequential manner.

In any case, upon completion of the ripple programming of the modified contents from RAM 14 into the appropriate locations of EEPROM array 11, integrated circuit 15 executes the remainder of its power-down sequence in process 52, eventually resulting in integrated circuit 15 being completely powered-down. Upon completion of power-down sequence 52, and the powering-down of integrated circuit 15, the new modified contents are safely stored in non-volatile EEPROM array 11. After the passage of time, on the other hand, the stored state of memory cells in RAM 14 can eventually dissipate, as conventional in volatile memory resources. Integrated circuit 15 thus awaits the next power-on event, in which case the process of FIG. 6 is repeated.

According to this embodiment of the invention, the ripple programming operation carried out in process 50 in response to a power-down request is much more efficiently performed than in conventional EEPROM memories and integrated circuits in which those EEPROM memories are embedded. This improved efficiency is reflected not only in terms of a much shorter programming time but also in a corresponding reduction in power consumed, and as such is especially useful in connection with power-down sequencing where the external power may be limited (e.g., stored in a capacitor associated with integrated circuit 15, or provided from a battery). In addition, as mentioned above, the operation of integrated circuit 15 with embedded EEPROM memory 12 according to this embodiment of the invention is especially well-suited for this application, in which the number of programming cycles over the life of integrated circuit 15 is relatively limited. To the extent that deleterious effects from hot carrier effects and the like may be more likely as a result of this invention, in which the high word line programming voltage is maintained while the bit line programming voltage is hot-switched among the bit lines, the EEPROM emulation mode operation described relative to FIG. 6 greatly minimizes the detectable effects on the memory cells.

Figure 7:
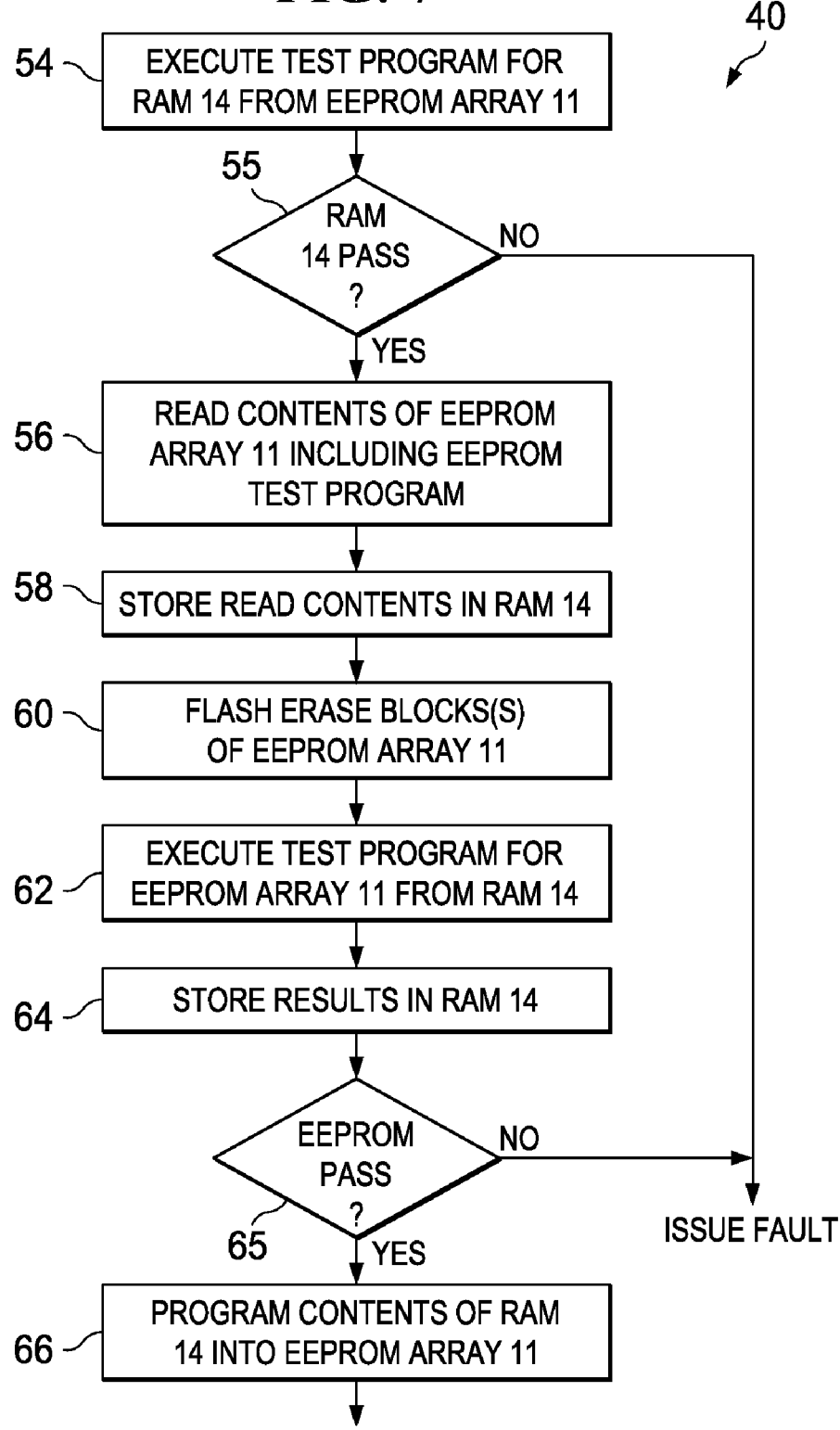
FIG. 7 is a flow diagram illustrating the operation of the large-scale integrated circuit of FIG. 2 in a built-in self-test operation, according to an embodiment of this invention.

As mentioned above, BIST process 40 may include a self-test sequence of memory resources. Referring now to FIG. 7, an example of a portion of BIST process 40 involving EEPROM memory 12 according to an embodiment of this invention will be described. In this embodiment of the invention, EEPROM memory 12 stores the actual test program used to perform the BIST of memory functions, including a test program for EEPROM memory 12 itself.

BIST process 40 begins, in this example, with process 54, in which CPU core 10 (or memory manager function 20, or other logic circuitry, as the case may be) executes program instructions stored in EEPROM memory 12 to test the functionality of RAM 14. This test program executed in process 54 can correspond to conventional functional memory test routines that ensure that each memory cell in RAM 14 can store both "0" and "1" states, to ensure the proper operation of address decoders in RAM 14 (e.g., the well-known "march" routine), and to ensure the absence of leakage among neighboring memory cells (e.g., "checkerboard" or "disturb" routines). In decision 55, CPU core 10 determines whether the test of RAM 14 was successful. If not (decision 55 is no), a "fault" signal is issued, following which the appropriate actions are taken according to the overall BIST process 40.

Upon the successful testing of RAM 14 (decision 55 is yes), process 56 is next performed to read the contents of EEPROM array 11, in combination with process 58 in which those contents are stored in RAM 14. As discussed above in connection with FIG. 6, memory manager function 20 can include some buffering to assist in processes 56, 58, and these processes 56, 58 can be performed simultaneously or in some alternating fashion, thus minimizing the need for data buffering. Once these contents are stored in RAM 14 in process 58, the corresponding block or blocks of EEPROM array 11 are erased, in process 60.

According to this embodiment of the invention, at least a portion of the contents of EEPROM memory 12 that were read in process 56 and stored in RAM 14 in process 58 include a test program that, when executed, tests the operation of EEPROM memory 12 itself. In process 62, CPU core 10 (or memory manager function 20, or other circuitry within integrated circuit 15, as the case may be) executes that test program by fetching the corresponding instructions from RAM 14. As known in the art, the testing of EEPROM memory involves the reading and programming of memory cells to ensure that all available states can be stored in the tested cells, and to ensure that the address decoder and other peripheral circuitry function properly. Additional parametric tests can also be performed, as desired, to determine noise margins and other performance and reliability indicators. Such test algorithms and routines for EEPROM memories are known in the art, and may be incorporated within process 62 (and thus within the contents originally stored in EEPROM array 11 itself). CPU core 10 stores the results of EEPROM test process 62 in locations of RAM 14, in process 64.

Decision 65 is then performed by CPU core 10 (or such other circuitry within integrated circuit 15) to analyze the results of the test stored in RAM 14, and thus to determine whether EEPROM memory 12 is adequately functional. As known in the art, EEPROM memory cells can degrade over time and over a number of erase and programming operations; many EEPROMs therefore typically include some level of error correction capability, generally realized by way of additional memory locations that store parity bits associated with the actual data being stored, which permits some number of the EEPROM cells to be inoperative without resulting in loss of payload data. As such, the analysis of decision 65 may differ from a simple go-no go decision, but rather may include a determination of whether a number of failed or failing memory cells 22 within EEPROM array 11 exceed the number that can be tolerated. In any event, if the EEPROM test performed within this portion of BIST process 40 fails (decision 65 is no), then a fault is issued by BIST logic 21, and the appropriate actions are then taken by integrated circuit 15 according to the BIST algorithm being used.

On the other hand, if the test of EEPROM memory 12 performed as part of BIST process 40 is successful (decision 65 is yes), then the contents of RAM 14 are programmed back into EEPROM array 11, for further analysis if desired, but in any case for use in the next instance of BIST process 40. According to this embodiment of the invention, the ripple programming approach described above in connection with FIG. 5 is used to re-program EEPROM array 11, thus greatly reducing the programming time required for process 66 and thus reducing the test time required for BIST process 40. Of course, to the extent that test states remain within EEPROM array 11 as a result of the test program executed in process 62, a block or blocks within EEPROM array 11 are erased as part of process 66, enabling the storing of the contents of RAM 14. Following process 66, the contents of RAM 14 may be overwritten as desired.

As in the previously-described embodiments of this invention and as mentioned above, the improved efficiency provided by the ripple programming capability of EEPROM memory 12 within integrated circuit 15 is reflected in a much shorter programming time during BIST processing, and thus in a much reduced time required for power-on sequencing of integrated circuit 15. These benefits are also apparent in the reduced power consumption of integrated circuit 15. In addition, the ripple programming provided according to this invention is also well-suited for internal control, for example by memory manager function 20 and BIST logic 21 in integrated circuit 15.

These advantages of reduced programming time and internal control can also be attained in connection with EEPROM memories of different arrangements than those described above in connection with these embodiments of the invention, and also in connection with methods of operating such non-volatile memories in other applications and uses. In addition, it is contemplated that this invention can provide important advantages not only for embedded EEPROM and non-volatile memories, but also for EEPROM memories realized as stand-alone memory devices.

Therefore, while the present invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of programming memory cells in an electrically erasable programmable solid-state memory array including a plurality of memory cells arranged in rows and columns, wherein each memory cell includes a control gate and a source/drain path in a floating-gate transistor, the method comprising the steps of:

applying a first programming voltage to a word line corresponding to a first selected row of memory cells, the word line coupled to the control gate of each of the memory cells in the selected row;

during the step of applying the first programming voltage and for each of a plurality of column addresses, sequentially applying a second programming voltage to one or more bit lines associated with each of the plurality of column addresses, each bit line corresponding to a column of memory cells and coupled to the source/drain path of each memory cell in that column;

then removing the first programming voltage from the word line to the first selected row of memory cells;

wherein the first and second programming voltages are selected so as to program each memory cell receiving the combination of the first programming voltage at its control gate and the second programming voltage at its source/drain path.

2. The method of claim 1, further comprising:
receiving and decoding a first row address;
wherein the first selected row of memory cells corresponds to the decoded first row address;
and further comprising:
receiving and decoding each of the plurality of column addresses.

3. The method of claim 2, further comprising:
after the step of removing the first programming voltage, receiving and decoding a second row address;
receiving and decoding each of a plurality of column addresses associated with the second row address; and
repeating the applying, sequentially applying, and removing steps.

4. The method of claim 1, wherein a single bit line corresponds to each of the plurality of column addresses.

5. The method of claim 1, wherein a plurality of bit lines corresponds to each of the column addresses;
wherein the step of sequentially applying the second programming voltage comprises, for each of the plurality of column addresses, applying the second programming voltage to the plurality of bit lines corresponding to the column address.

6. The method of claim 1, further comprising:
receiving an input data value associated with each of the plurality of column addresses;
wherein the step of applying the second programming voltage to one of the bit lines associated with each column address is performed responsive to at least a portion of the input data value having a value corresponding to a programmed memory cell state for that bit line.

7. The method of claim 1, wherein the sequentially applying step applies the second programming voltage to one or more bit lines associated with the plurality of column addresses according to a sequence based on the values of the plurality of column addresses.

8. The method of claim 1, further comprising:
before the step of applying the first programming voltage, erasing one or more blocks of memory cells in the array.

9. The method of claim 8, further comprising:
before the erasing step, reading contents from memory cells in the array;
then storing the read contents in a random access memory;
then modifying the stored contents in the random access memory;
wherein the step of applying the second programming voltage to one of the bit lines associated with each column address is performed according to the modified stored contents in the random access memory.

10. The method of claim 9, wherein the random access memory and the electrically erasable programmable solid-state memory array are formed in the same integrated circuit as one another;
and wherein the modifying step is performed by functional circuitry also formed in the same integrated circuit as the random access memory and the electrically erasable programmable solid-state memory array.

11. The method of claim 9, wherein the reading and storing steps are performed responsive to power-up of an integrated circuit including the memory array;
and wherein the applying, sequentially applying, and removing steps are performed responsive to a power-down request for the integrated circuit including the memory array.

12. The method of claim 11, wherein the contents read from the memory array comprise a memory test software routine;
and further comprising:
after the step of storing the read contents in the random access memory, executing the memory test software routine, wherein the memory test software routine comprises programming and reading memory locations in the memory array; and
then performing the applying, sequentially applying, and removing steps to program memory locations in the memory array with the contents stored in the random access memory.

13. An integrated circuit comprising:
an electrically erasable programmable solid-state memory array including a plurality of memory cells arranged in rows and columns, each memory cell including a control gate and a source/drain path in a floating-gate transistor;
a plurality of word line conductors, each coupled to the control gate in memory cells in an associated row of the memory array;
word line drive circuitry, for applying a first programming voltage to a word line associated with a selected row of the memory array;
a plurality of bit line conductors, each coupled to one end of the source/drain path of memory cells in an associated column of the memory array, the other end of the source/drain path of each memory cell coupled to a reference voltage;
bit line drive circuitry, for applying a second programming voltage to one or more bit lines, each associated with a selected column of the memory array;
control logic, for controlling the word line drive circuitry and the bit line drive circuitry to program one or more of the memory cells of the memory array, by controlling the word line drive circuitry to apply the first programming voltage to a word line corresponding to a row address, and by sequentially controlling the bit line drive circuitry to sequentially apply the second programming voltage to one or more bit lines associated with each of a plurality of column addresses, while the word line drive circuitry is applying the first programming voltage; and
memory manager circuitry, for controlling operation of the integrated circuit to read contents from the electrically erasable programmable solid-state memory array, write those contents into the random access memory, erase at least a portion of the electrically erasable programmable solid-state memory array, and then, after contents of the random access memory have been modified by the functional circuitry, controlling the control logic to program one or more of the memory cells of the memory array, according to the modified contents of the random access memory, by controlling the word line drive circuitry to apply the first programming voltage to a word line corresponding to a row address, and by sequentially controlling the bit line drive circuitry to sequentially apply the second programming voltage to one or more bit lines associated with each of a plurality of column addresses, while the word line drive circuitry is applying the first programming voltage.

14. The integrated circuit of claim 13, wherein the control logic comprises:
   address decoder circuitry, for receiving a memory address value and for controlling the word line drive circuitry and the bit line drive circuitry to apply the first and second programming voltages, respectively, responsive to the received memory address value.

15. The integrated circuit of claim 14, further comprising:
   functional circuitry;
   a bus, coupled to the functional circuitry and to the control logic,
   wherein memory address values are received by the address decoder circuitry in the control logic via the bus.

16. The integrated circuit of claim 15, wherein the control logic couples input data received over the bus to the bit line drive circuitry; and wherein the control logic applies the second programming voltage to the one or more bit lines responsive to at least a portion of the input data value having a value corresponding to a programmed memory cell state for that bit line.

17. The integrated circuit of claim 15, further comprising:
   a random access memory, coupled to the bus.

18. The integrated circuit of claim 15, further comprising:
   a random access memory, coupled to the bus; and
   built-in self-test logic, for controlling operation of the integrated circuit to read contents comprising a memory test software routine from the electrically erasable programmable solid-state memory array and write those contents into the random access memory, erase at least a portion of the electrically erasable programmable solid-state memory array, so that the functional circuitry executes the memory test software routine stored in the random access memory.

* * * * *